(12) United States Patent
Heinrich

(10) Patent No.: US 11,817,417 B2
(45) Date of Patent: Nov. 14, 2023

(54) SEMICONDUCTOR DEVICE AND METHOD FOR FABRICATING A SEMICONDUCTOR DEVICE

(71) Applicant: Infineon Technologies Austria AG, Villach (AT)

(72) Inventor: Alexander Heinrich, Bad Abbach (DE)

(73) Assignee: Infineon Technologies Austria AG, Villach (AT)

( * ) Notice: Subject to any disclaimer, the term of this patent is extended or adjusted under 35 U.S.C. 154(b) by 100 days.

(21) Appl. No.: 17/062,685

(22) Filed: Oct. 5, 2020

(65) Prior Publication Data

US 2021/0111143 A1    Apr. 15, 2021

(30) Foreign Application Priority Data

Oct. 11, 2019   (EP) ..................................... 19202745

(51) Int. Cl.
    *H01L 23/00*    (2006.01)

(52) U.S. Cl.
    CPC .............. *H01L 24/32* (2013.01); *H01L 24/83* (2013.01); *H01L 2224/32503* (2013.01);
    (Continued)

(58) Field of Classification Search
    None
    See application file for complete search history.

(56) References Cited

U.S. PATENT DOCUMENTS

| 2007/0141750 A1* | 6/2007 | Iwasaki ................... H01L 24/11 257/E21.705 |
| 2014/0077377 A1 | 3/2014 | Sasaki et al. |

(Continued)

FOREIGN PATENT DOCUMENTS

| EP | 2993692 A2 | 3/2016 |
| WO | 8402097 A1 | 6/1984 |

(Continued)

OTHER PUBLICATIONS

Chang, Tao-Chih , et al., "Dual-phase solid-liquid interdiffusion bonding, a solution for the die attachment of WBG", 14th Intern. Conference on Electronic Material and Packaging, Dec. 13, 2012.
Wang, Y. W., et al., "Reaction Within Ni/Sn/Cu Microjoints for Chip-Stacking Applications", Journal of Electronic Materials, vol. 48, No. 1, 2019, Aug. 22, 2018, 25-31.

*Primary Examiner* — Hung K Vu
(74) *Attorney, Agent, or Firm* — Murphy, Bilak & Homiller, PLLC

(57) ABSTRACT

A semiconductor device includes a semiconductor die with a metallization layer including a first metal with a comparatively high melting point, a die carrier including a second metal with a comparatively high melting point, a first intermetallic compound arranged between the semiconductor die and the die carrier and including the first metal and a third metal with a comparatively low melting point, a second intermetallic compound arranged between the first intermetallic compound and the die carrier and including the second metal and the third metal, and precipitates of a third intermetallic compound arranged between the first intermetallic compound and the second intermetallic compound and including the third metal and a fourth metal with a comparatively high melting point.

14 Claims, 4 Drawing Sheets

(52) U.S. Cl.
CPC ............... *H01L 2224/8381* (2013.01); *H01L 2924/0103* (2013.01); *H01L 2924/0105* (2013.01); *H01L 2924/01013* (2013.01); *H01L 2924/01015* (2013.01); *H01L 2924/01023* (2013.01); *H01L 2924/01028* (2013.01); *H01L 2924/01029* (2013.01); *H01L 2924/01031* (2013.01); *H01L 2924/01046* (2013.01); *H01L 2924/01047* (2013.01); *H01L 2924/01049* (2013.01); *H01L 2924/01078* (2013.01); *H01L 2924/01079* (2013.01); *H01L 2924/3512* (2013.01)

(56) References Cited

U.S. PATENT DOCUMENTS

| | | | |
|---|---|---|---|
| 2014/0097534 A1* | 4/2014 | Chang | H01L 21/76885 257/737 |
| 2014/0217595 A1 | 8/2014 | Sakurai et al. | |
| 2016/0049564 A1* | 2/2016 | Chu | H01L 24/24 257/762 |

FOREIGN PATENT DOCUMENTS

| | | |
|---|---|---|
| WO | 2007088951 A1 | 8/2007 |
| WO | 2016122776 A1 | 8/2016 |

\* cited by examiner

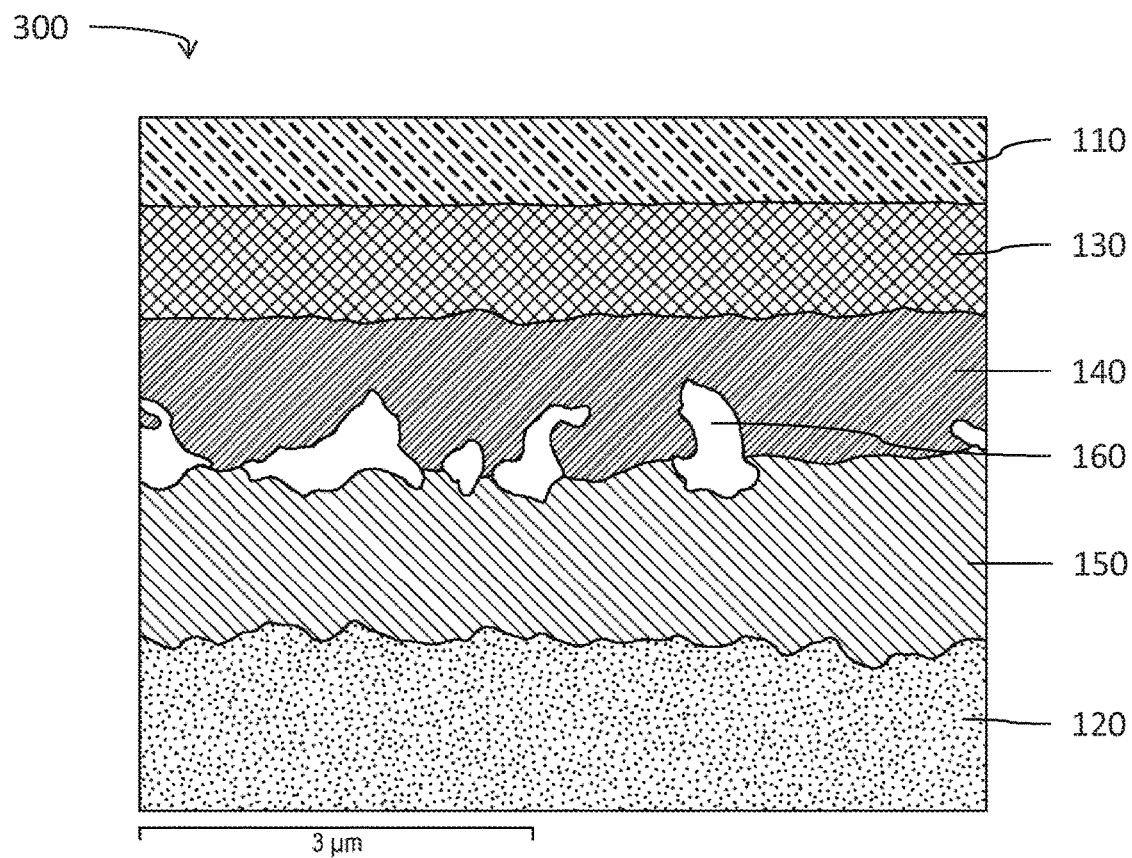
Fig. 3
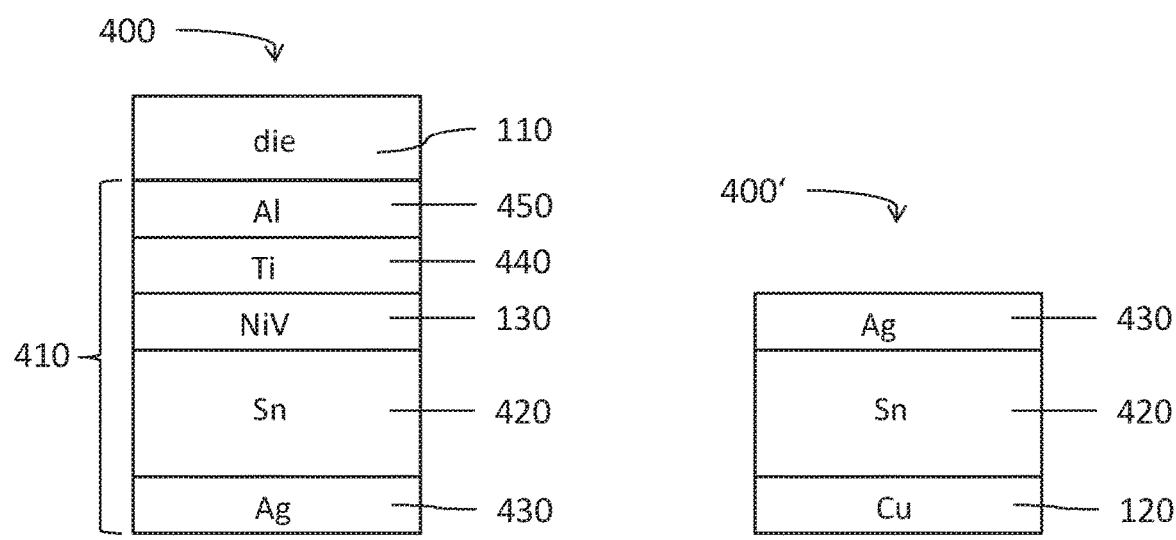
Fig. 4A
Fig. 4B

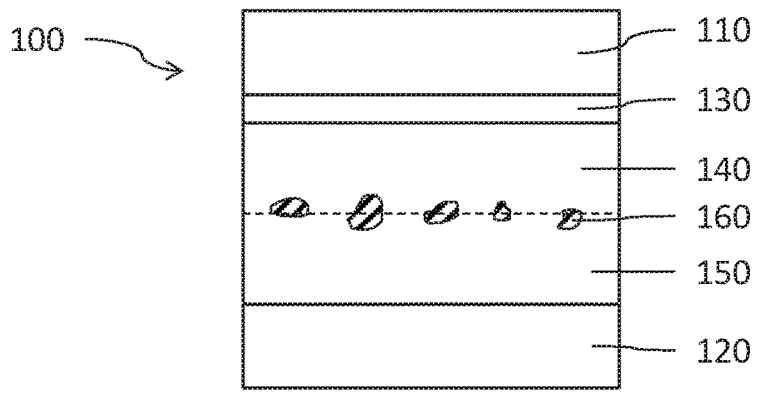

| | |
|---|---|
| Providing a semiconductor die with a metallization layer comprising a first metal with a comparatively high melting point | — 701 |
| Providing a die carrier comprising a second metal with a comparatively high melting point | — 702 |
| Providing a solder material comprising a third metal with a comparatively low melting point | — 703 |
| Providing a layer of a fourth metal with a comparatively high melting point on the semiconductor die or on the die carrier | — 704 |
| Soldering the semiconductor die to the die carrier and thereby creating: a first intermetallic compound arranged between the semiconductor die and the die carrier and comprising the first metal and the third metal, a second intermetallic compound arranged between the first intermetallic compound and the die carrier and comprising the second metal and the third metal, and precipitates of a third intermetallic compound arranged between the first intermetallic compound and the second intermetallic compound and comprising the third metal and the fourth metal | — 705 |

Fig. 7

SEMICONDUCTOR DEVICE AND METHOD FOR FABRICATING A SEMICONDUCTOR DEVICE

TECHNICAL FIELD

This disclosure relates in general to a semiconductor device and method for fabricating a semiconductor device.

BACKGROUND

A semiconductor device may comprise a solder joint, in particular a diffusion solder joint, that electrically and/or mechanically fixes a semiconductor die to a die carrier. Such solder joints may need to be highly resilient against mechanical stress for the semiconductor device to fulfill stringent reliability requirements. However, dislocation movement in such solder joints are a common problem that may lead to cracks and consequently to mechanical and/or electrical failure of the solder joint. It may therefore be desirable to increase the stability of the solder joints and thereby reduce or eliminate dislocation movement and crack formation. Improved semiconductor devices and improved method for fabricating a semiconductor device may help to solve these and other problems.

The problem on which the invention is based is solved by the features of the independent claims. Further advantageous examples are described in the dependent claims.

SUMMARY

Various aspects pertain to a semiconductor device, comprising: a semiconductor die with a metallization layer comprising a first metal with a comparatively high melting point, a die carrier comprising a second metal with a comparatively high melting point, a first intermetallic compound arranged between the semiconductor die and the die carrier and comprising the first metal and a third metal with a comparatively low melting point, a second intermetallic compound arranged between the first intermetallic compound and the die carrier and comprising the second metal and the third metal, and precipitates of a third intermetallic compound arranged between the first intermetallic compound and the second intermetallic compound and comprising the third metal and a fourth metal with a comparatively high melting point.

Various aspects pertain to a method for fabricating a semiconductor device, the method comprising: providing a semiconductor die with a metallization layer comprising a first metal with a comparatively high melting point, providing a die carrier comprising a second metal with a comparatively high melting point, providing a solder material comprising a third metal with a comparatively low melting point, providing a layer of a fourth metal with a comparatively high melting point on the semiconductor die or on the die carrier, soldering the semiconductor die to the die carrier and thereby creating: a first intermetallic compound arranged between the semiconductor die and the die carrier and comprising the first metal and the third metal, a second intermetallic compound arranged between the first intermetallic compound and the die carrier and comprising the second metal and the third metal, and precipitates of a third intermetallic compound arranged between the first intermetallic compound and the second intermetallic compound and comprising the third metal and the fourth metal.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

FIG. 3 shows a scanning electron microscopy image of a semiconductor device comprising a diffusion solder joint with the precipitates.

FIGS. 4A and 4B show a semiconductor die with a stack of metal layers including a soft solder material layer (FIG. 4A) and a die carrier with a stack of metal layers including a soft solder material layer (FIG. 4B).

FIGS. 6A to 6E show a semiconductor device in various stages of fabrication according to an exemplary method for fabricating semiconductor devices.

FIG. 7 is a flow chart of a method for fabricating a semiconductor device.

DETAILED DESCRIPTION

In the following detailed description, directional terminology, such as "top", "bottom", "left", "right", "upper", "lower" etc., may be used with reference to the orientation of the Figure(s) being described. Because components of the disclosure can be positioned in a number of different orientations, the directional terminology is used for purposes of illustration.

To the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a semiconductor device described below may use various types of semiconductor dies or circuits incorporated in the semiconductor dies, among them AC/DC or DC/DC converter circuits, power MOS transistors, power Schottky diodes, JFETs (Junction Gate Field Effect Transistors), power bipolar transistors, power integrated circuits, etc. The examples may also use semiconductor dies comprising transistor structures in which at least one electrical contact pad is arranged on a first main face of the semiconductor die and at least one other electrical contact pad is arranged on a second main face of the semiconductor die opposite to the first main face of the semiconductor die.

The notation XY may refer to an alloy of X including at least Y as a further component. In particular, it may refer to an alloy of X including Y as a sole residual component (i.e. a closed composition). That is, in the second case, the notation XY means that the alloy XY has a composition consisting of X (of the percentage in weight of X) and Y (of the percentage in weight of Y), the balance being only inevitable elements. The notation XYZ . . . has an analogous meaning, i.e. an "open composition" or a "closed composition" with X, Y, Z, . . . forming the sole constituents of the alloy (except inevitable elements). The same may apply to solder compositions.

Figure 1:
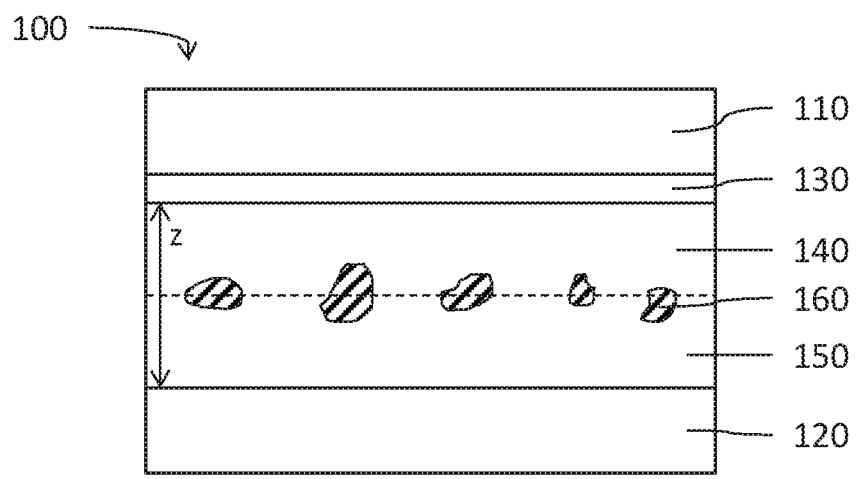
FIG. 1 shows a schematic sectional view of a semiconductor device, wherein precipitates of a third intermetallic compound arranged within a diffusion solder joint comprising a first and a second intermetallic compound.

FIG. 1 shows a semiconductor device 100 comprising a semiconductor die 110 and a die carrier 120. The semiconductor die 110 has a metallization layer 130 arranged on one side, wherein the metallization layer 130 comprises a first metal with a comparatively high melting point. The die carrier 120 comprises a second metal which also has a comparatively high melting point.

The metallization layer 130 may be arranged between the semiconductor die 110 and the die carrier 120 and it may e.g. be a backside metallization layer of the semiconductor die 110.

The semiconductor device 100 further comprises a first intermetallic compound (IMC) 140 arranged between the semiconductor die 110 and the die carrier 120 and a second intermetallic compound 150 arranged between the first IMC 140 and the die carrier 120.

The first IMC 140 comprises the first metal and a third metal, wherein the third metal has a comparatively low melting point. The second IMC comprises the second metal and the third metal.

The semiconductor device 100 further comprises precipitates 160 of a third intermetallic compound arranged between the first IMC 140 and the second IMC 150. The precipitates comprise the third metal and a fourth metal with a comparatively high melting point.

In the context of this disclosure a metal with a "comparatively high melting point" may be with a melting point that is higher than the melting point of another metal. For example, the first, second and fourth metals may each have a melting point that is higher than the melting point of the third metal. The melting point of the first, second and third metals may e.g. be 10° C., 20° C., 30° C., 50° C. or more higher than the melting point of the third metal. A "comparatively low melting point" may be understood analogically.

The semiconductor device 100 may e.g. be a power semiconductor device and the semiconductor die 110 may be a power semiconductor die. The first IMC 140, the second IMC 150 and the precipitates 160 may be part of a solder joint that electrically and/or mechanically couples the semiconductor die 110 to the die carrier 120.

The third metal may be a solder material, in particular a soft solder material. The first and second IMCs 140 and 150 may be fabricated by soldering the semiconductor die 110 to the die carrier 120. The semiconductor die 110 may still be part of a wafer when it is soldered to the die carrier 120 or it may be singulated prior to soldering.

The die carrier 120 may e.g. be part of a leadframe. The die carrier 120 may comprise the second metal or it may also consist of the second metal. According to an example, the die carrier 120 may comprise a plating layer, e.g. a Ni plating layer. The plating layer may provide the second metal. However, it is also possible that a bulk part of the die carrier 120 may provide the second metal.

The first metal may be one of Cu, Ni, Ag, Al, Au, Pd or Pt. The second metal may be one of Cu, Ni, Ag, Al, Au, Pd or Pt. The third metal may be one of Sn, In, Zn or Ga. The fourth metal may be one of Ag, Au, Pd or Pt. According to an example, metal alloys may be used instead of single metals. For example, the first metal and/or the second metal may be NiV or NiP. The third metal may e.g. be SnAgCu instead of Sn.

According to an example, the first metal is Ni, the second metal is Cu, the third metal is Sn, the fourth metal is Ag, the first IMC 140 comprises $Ni_3Sn_4$, the second IMC 150 comprises $Cu_3Sn$ and the precipitates 160 comprise $Ag_3Sn$. According to another example, the first metal and the second metal are both Cu or both Ni (in other words, the first and second IMCs 140, 150 may have identical or similar material compositions), the third metal is Sn and the fourth metal is Ag.

A thickness z of the first and second IMCs 140, 150 combined may e.g. be in the range of 1 μm to 10 μm, in particular 2 μm to 6 μm, or 2.5 μm to 3.5 μm. The thickness z may be the thickness of the solder joint or bond line between the semiconductor die 110 and the die carrier 120.

The precipitates 160 may have a size, e.g. a diameter, in the range of 0.5 μm to 3 μm, or 1 μm to 2 μm. The precipitates may e.g. on average have an oblong shape, an angular shape or an irregular shape. Each of the precipitates 160 may have a diameter that is less than 60% of the thickness z.

The precipitates 160 may be spaced apart from one another. For example, the precipitates may on average be spaced apart with about half a diameter between two neighboring precipitates 160, or with about one diameter between two neighboring precipitates, or with about 0.5 μm or about 1.0 μm between two neighboring precipitates.

The precipitates 160 may for example be arranged at an interface between the first IMC 140 and the second IMC 150 (indicated by the dashed line in FIG. 1). The precipitates 160 may be arranged side-by-side along the interface. It is also possible that the precipitates 160 are arranged essentially in the middle between the semiconductor die 110 and the die carrier 120. Alternatively, the precipitates 160 may be arranged closer to the semiconductor die 110 or closer to the die carrier 120.

The position of the precipitates 160 may depend on the reaction rates with which the IMCs 140 and 150 form. For example, identical reaction rates of the first and second IMCs 140, 150 may result in the precipitates being arranged in the middle between the semiconductor die 110 and the die carrier 120.

The precipitates 160 may have the effect of preventing cracks in the solder joint comprising the first and second IMCs 140, 150 from forming or at least from growing in size as explained in the following.

Figure 2:
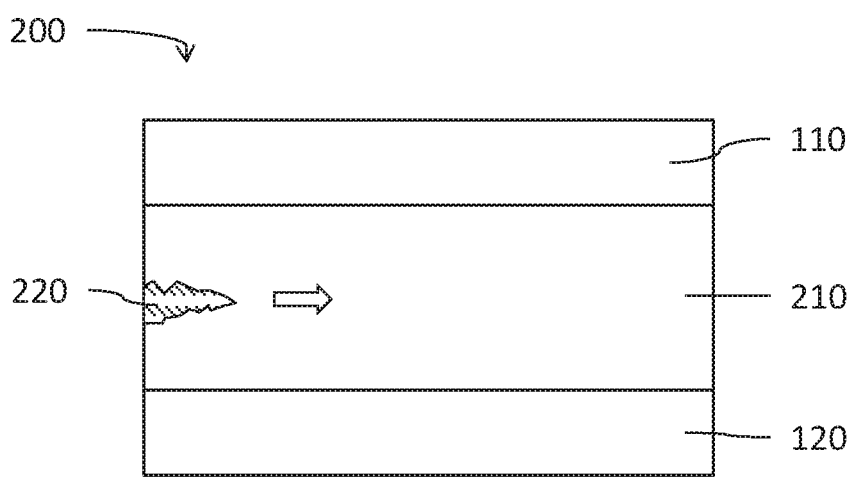
FIG. 2 shows a schematic sectional view of a diffusion solder joint without precipitates, wherein a crack forms in the diffusion solder joint.

FIG. 2 shows a semiconductor device 200 comprising the semiconductor die 110, the die carrier 120 and a solder joint 210 that does not comprise the precipitates 160. A crack 220 may form in the solder joint 210, e.g. due to differences in the coefficient of thermal expansion of the semiconductor die 110 and the die carrier 120. E.g. due to dislocation movements the crack 220 may grow (for example along the arrow in FIG. 2, parallel to the surfaces of the semiconductor die 110 and the die carrier 120) and may eventually cause a mechanical and/or electrical failure of the solder joint 210.

The precipitates 160 however may strengthen (harden) the solder joint between the semiconductor die 110 and the die carrier 120 and may prevent dislocation movements in the IMCs 140, 150 ("precipitation hardening"). The precipitates 160 may therefore improve the reliability of the semiconductor device 100.

FIG. 3 shows a scanning electron microscopy image of an exemplary semiconductor device 300. The semiconductor device 300 may be similar or identical to the semiconductor device 100.

In the semiconductor device 300 the semiconductor die 110 may e.g. comprise Si. The metallization layer 130 may comprise or consist of NiV. The first IMC 140 may comprise or consist of $Ni_3Sn_4$. The second IMC 150 may comprise or consist of $Cu_3Sn$. The precipitates 160 may comprise or consist of $Ag_3Sn$. The die carrier 120 may comprise or consist of Cu.

According to an example, the individual parts of the semiconductor device 300 may have the following material compositions:
  metallization layer 130: 5 wt % V, 95 wt % Ni
  first IMC 140: 32 wt % Ni, 22 wt % Cu, 46 wt % Sn
  second IMC 150: 70 wt % Cu, 30 wt % Sn
  precipitates 160: 8 wt % Cu, 70 wt % Ag, 22 wt % Sn
  die carrier 120: 100 wt % Cu According to an example, the above-described material compositions may vary. For example, the percentage of each component may be up to 3 wt % higher or lower than indicated above.

According to a further example, the individual parts of the semiconductor device 300 may have the following material compositions:
  metallization layer 130: 5 wt % V, 95 wt % Ni
  first IMC 140: 49 wt % Ni, 51 wt % Sn
  second IMC 150: 49 wt % Ni, 51 wt % Sn
  precipitates 160: 78 wt % Ag, 22 wt % Sn
  die carrier 120: 100 wt % Cu The semiconductor device 300 may further comprise a plating layer arranged on the die carrier 120 below the second IMC 150. The plating layer may comprise 100 wt % Ni.

FIG. 4A shows a precursor arrangement 400 comprising the semiconductor die 110 and a layer stack 410 arranged on the semiconductor die 110. The precursor arrangement 400 may be used in the fabrication of the semiconductor devices 100 and 300.

The layer stack 410 may comprise the metallization layer 130, a first layer 420 arranged on the metallization layer 130 and a second layer 430 arranged on the first layer 420. The first layer 420 may be a solder material layer and the second layer 430 may be a cap layer.

The first layer 420 may comprise the third metal with a comparatively low melting point and the second layer 430 may comprise the fourth metal with a comparatively high melting point.

The layer stack 410 may further comprise a third layer 440 and a fourth layer 450 arranged between the metallization layer 130 and the semiconductor die 110.

According to an example, the metallization layer 130 comprises NiV and may e.g. have a thickness of 500 nm to 750 nm. The first layer 420 may comprise Sn and may have a thickness of about 1200 nm. The first layer 430 may comprise Ag and may have a thickness of about 200 nm. The third layer 440 may comprise Ti and may have a thickness of about 200 nm. The fourth layer 450 may comprise Al and may have a thickness of about 200 nm.

The precursor arrangement 400 may be placed on a die carrier 120 and subsequently a diffusion soldering process may be performed in order to fabricate the semiconductor device 100 or 300.

The precursor arrangement 400 may show solder material (e.g. Sn) that is arranged on the semiconductor die 110 prior to diffusion soldering and fabrication of the IMCs 140, 150 and the precipitates 160. However, it is also possible that the solder material is provided on the die carrier 120 instead.

FIG. 4B shows a further precursor arrangement 400' comprising the die carrier 120, the first layer 420 and the second layer 430. A semiconductor die 110 having the metallization layer 130 and optionally the third and fourth layers 440, 450 arranged on one side may be placed onto the second layer 430 and subsequently a diffusion soldering process may be performed to fabricate the semiconductor device 100 or 300.

Figure 5A:
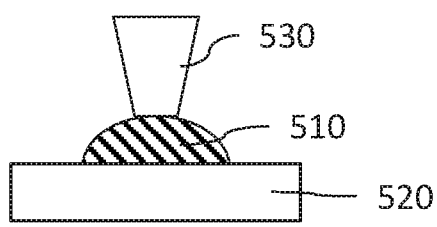
FIGS. 5A and 5B show two methods for depositing solder material on a substrate: by dispensing (FIG. 5A) and by depositing a preform (FIG. 5B).

FIG. 5A shows an exemplary method for depositing solder material 510 on a substrate 520. The solder material may e.g. comprise Sn. The substrate 520 may comprise the semiconductor die 110 or alternatively the die carrier 120.

As shown in FIG. 5A, the solder material 510 may e.g. be deposited on the substrate 520 by a dispensing process. For example, a dispensing unit 530 may be used to dispense the solder material 510 in fluid form. The solder material 510 may comprise a fluxing agent which may be removed from the solder material 510 after the dispensing process.

Figure 5B:
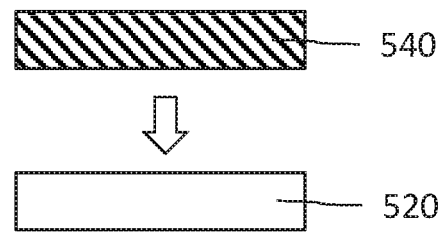

FIG. 5B shows a further exemplary method for depositing solder material on the substrate 520. According to this method, solder material is provided as a solder preform 540 that may be deposited on the substrate 520 as a whole (e.g. by a pick-and-place process). The solder preform 540 may comprise a certain minimum thickness in order to have sufficient structural stability for handling the deposition process. The minimum thickness may e.g. be more than 10 μm or more than 20 μm.

The solder preform 540 may comprise a (temporary) carrier, wherein the solder material is arranged on the carrier. The solder preform 540 may be free of any fluxing agent.

FIGS. 6A to 6E show the semiconductor device 100 in various stages of fabrication according to an exemplary method for fabricating semiconductor devices.

Figure 6A:
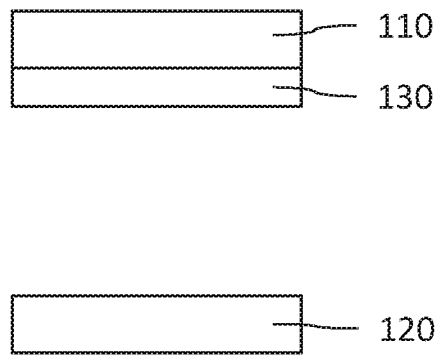

As shown in FIG. 6A, the semiconductor die 110 with the metallization layer 130 is provided, wherein the metallization layer 130 comprises the first metal with a comparatively high melting point. The metallization layer 130 may e.g. be provided on the semiconductor die 110 using a plating process or a dispensing process. Furthermore, the die carrier 120 comprising the second metal with a comparatively high melting point is provided.

Figure 6B:
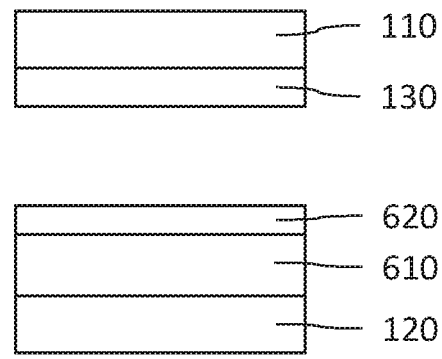

As shown in FIG. 6B, a solder material 610 comprising the third metal with a comparatively low melting point may be provided on the die carrier 120. The solder material 610 may e.g. be provided by dispensing or as a solder preform as described with respect to FIGS. 5A and 5B. Furthermore, a metal layer 620 comprising the fourth metal with a comparatively high melting point may be provided on the solder material 610. Providing the metal layer 620 may e.g. comprise a dispensing process or a plating process.

Figure 6C:
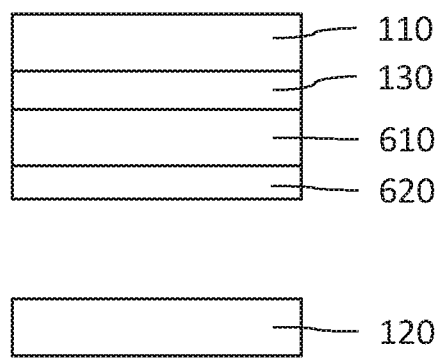

Alternatively to what is shown in FIG. 6B, the solder material 610 may instead be provided on the semiconductor die 110 (in particular, on the metallization layer 130), compare FIG. 6C. The metal layer 620 may be provided on the solder material 610, e.g. after depositing the solder material 610 on the semiconductor die 110.

Figure 6D:
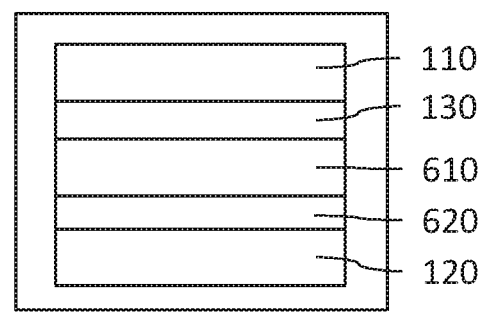

As shown in FIG. 6D, the semiconductor die 110 is diffusion soldered to the die carrier 120. Diffusion soldering may comprise placing the semiconductor die 110 onto the die carrier 120 such that the metallization layer 130, the solder material 610 and the metal layer 620 are arranged between the semiconductor die 110 and the die carrier 120. The diffusion soldering may, e.g., be performed in an oven. Diffusion soldering may comprise heating the solder material 610 to a temperature above its melting point, e.g. to a temperature of 230° C. or more, for a certain duration of time (e.g. 1 min or more, 5 min or more, or 10 min or more), to allow the solder material 610 to react with the first, third and fourth metals with the comparatively high melting point to form the IMCs 140, 150 and the precipitates 160. After soldering the semiconductor device 100 may be allowed to cool down to room temperature. Diffusion soldering may also be performed such that no unreacted solder material 610 remains after the soldering (in other words, all of the solder material is part of an IMC after soldering).

During diffusion soldering the solder material 610 may react with the material of the metallization layer 130 and the material of the die carrier 120 (or the material of a plating layer on top of the die carrier 120), thereby creating the first IMC 140 and the second IMC 150, respectively.

Furthermore, the solder material 610 may react with the material of the metal layer 620, thereby creating the precipitates 160 of the third IMC arranged between the first IMC 140 and the second IMC 150, compare FIG. 6E.

FIG. 7 is a flow chart of a method 700 for fabricating a semiconductor device. The method 700 may e.g. be used to fabricate the semiconductor devices 100 and 300.

The method 700 comprises at 701 providing a semiconductor die with a metallization layer comprising a first metal with a comparatively high melting point, at 702 providing a die carrier comprising a second metal with a comparatively high melting point, at 703 providing a solder material comprising a third metal with a comparatively low melting point, at 704 providing a layer of a fourth metal with a comparatively high melting point on the semiconductor die or on the die carrier, and at 705 soldering the semiconductor die to the die carrier and thereby creating: a first intermetallic compound arranged between the semiconductor die and the die carrier and comprising the first metal and the third metal, a second intermetallic compound arranged between the first intermetallic compound and the die carrier and comprising the second metal and the third metal, and precipitates of a third intermetallic compound arranged between the first intermetallic compound and the second intermetallic compound and comprising the third metal and the fourth metal.

According to an example of the method 700, the first metal and the second metal are different metals and according to another example, the first metal and the second metal are the same metal. The first metal may e.g. be Ni, NiV or NiP, the second metal may be Cu, the third metal may be Sn or SnAgCu and the fourth metal may be Ag.

According to an example of method 700, the first IMC may comprise $Ni_3Sn_4$, the second IMC may comprise $Cu_3Sn$ and the precipitates may comprise $Ag_3Sn$.

EXAMPLES

In the following, the semiconductor device and the method for fabricating a semiconductor device are further explained using specific examples.

Example 1 is a semiconductor device, comprising: a semiconductor die with a metallization layer comprising a first metal with a comparatively high melting point, a die carrier comprising a second metal with a comparatively high melting point, a first intermetallic compound arranged between the semiconductor die and the die carrier and comprising the first metal and a third metal with a comparatively low melting point, a second intermetallic compound arranged between the first intermetallic compound and the die carrier and comprising the second metal and the third metal, and precipitates of a third intermetallic compound arranged between the first intermetallic compound and the second intermetallic compound and comprising the third metal and a fourth metal with a comparatively high melting point.

Example 2 is the semiconductor device of example 1, wherein the first metal and the second metal are different metals.

Example 3 is the semiconductor device of example 1, wherein the first metal and the second metal are the same metal.

Example 4 is the semiconductor device of one of the preceding examples, wherein the first metal and the second metal are each one of Cu, Ni, NiV, NiP, Ag, Al, Au, Pd or Pt.

Example 5 is the semiconductor device of one of the preceding examples, wherein the third metal is one of Sn, SnAgCu, In, Zn or Ga.

Example 6 is the semiconductor device of one of the preceding examples, wherein the fourth metal is one of Ag, Au, Pt or Pd.

Example 7 is the semiconductor device of one of the preceding examples, wherein a diameter of each precipitate is less than 60% of a thickness of the first and second intermetallic compounds combined.

Example 8 is the semiconductor device of one of the preceding examples, wherein the precipitates are essentially arranged in a plane.

Example 9 is the semiconductor device of one of the preceding examples, wherein the precipitates are essentially arranged halfway between the semiconductor die and the die carrier.

Example 10 is the semiconductor device of one of the preceding examples, wherein the precipitates are disjointed inclusions within the first and second intermetallic compounds.

Example 11 is a method for fabricating a semiconductor device, the method comprising: providing a semiconductor die with a metallization layer comprising a first metal with a comparatively high melting point, providing a die carrier comprising a second metal with a comparatively high melting point, providing a solder material comprising a third metal with a comparatively low melting point, providing a layer of a fourth metal with a comparatively high melting point on the semiconductor die or on the die carrier, soldering the semiconductor die to the die carrier and thereby creating: a first intermetallic compound arranged between the semiconductor die and the die carrier and comprising the first metal and the third metal, a second intermetallic compound arranged between the first intermetallic compound and the die carrier and comprising the second metal and the third metal, and precipitates of a third intermetallic compound arranged between the first intermetallic compound and the second intermetallic compound and comprising the third metal and the fourth metal.

Example 12 is the method of example 11, wherein the first metal and the second metal are different metals.

Example 13 is the method of example 11, wherein the first metal and the second metal are the same metal.

Example 14 is the method of one of examples 11 to 13, wherein the third metal is Sn and wherein the fourth metal is Ag.

Example 15 is the method of example 14, wherein the precipitates comprise $Ag_3Sn$.

Example 16 is the method of one of examples 11 to 15, wherein the soldering is performed such that no unreacted third metal remains after the soldering.

Example 17 is the method of one of examples 11 to 16, wherein a thickness of the first and second intermetallic phases combined is less than 10 µm.

Example 18 is the method of one of examples 11 to 17, wherein providing the solder material comprises depositing the solder material on the semiconductor die or on the die carrier.

Example 19 is the method of one of examples 11 to 17, wherein the solder material is provided as a preform.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. A semiconductor device, comprising:
   a semiconductor die with a metallization layer comprising a first metal with a comparatively high melting point;
   a die carrier comprising a second metal with a comparatively high melting point;
   a first intermetallic compound arranged between the semiconductor die and the die carrier and comprising the first metal and a third metal with a comparatively low melting point;
   a second intermetallic compound arranged between the first intermetallic compound and the die carrier and comprising the second metal and the third metal; and
   precipitates of a third intermetallic compound arranged between the first intermetallic compound and the second intermetallic compound and comprising the third metal and a fourth metal with a comparatively high melting point,
   wherein the first metal and the second metal are different metals,
   wherein a surface of the first intermetallic compound contacts a surface of the second intermetallic compound, forming an interface.

2. The semiconductor device of claim 1, wherein the first metal and the second metal are each one of Cu, Ni, NiV, NiP, Ag, Al, Au, Pd or Pt.

3. The semiconductor device of claim 1, wherein the third metal is one of Sn, SnAgCu, In, Zn or Ga.

4. The semiconductor device of claim 1, wherein the fourth metal is one of Ag, Au, Pt or Pd.

5. The semiconductor device of claim 1, wherein a diameter of each precipitate is less than 60% of a thickness of the first and second intermetallic compounds combined.

6. The semiconductor device of claim 1, wherein the precipitates are arranged in a plane.

7. The semiconductor device of claim 1, wherein the precipitates are arranged halfway between the semiconductor die and the die carrier.

8. The semiconductor device of claim 1, wherein the precipitates are disjointed inclusions within the first and second intermetallic compounds.

9. The semiconductor device of claim 1, wherein the first metal is Ni, the second metal is Cu, the third metal is Sn, the fourth metal is Ag, the first IMC comprises $Ni_3Sn_4$, the second IMC comprises $Cu_3Sn$, and the precipitates comprise $Ag_3Sn$.

10. The semiconductor device of claim 1, wherein the precipitates are on average spaced apart with about half a diameter between two neighboring precipitates.

11. The semiconductor device of claim 1, wherein the precipitates are on average spaced apart with about one diameter between two neighboring precipitates.

12. The semiconductor device of claim 1, wherein the space between two neighboring precipitates is between 0.5 µm and 1.0 µm.

13. The semiconductor device of claim 1, wherein the precipitates of the third intermetallic compound are arranged at the interface.

14. The semiconductor device of claim 1, wherein the metallization layer is a backside metallization layer of the semiconductor die.

* * * * *